US012785643B2

(12) United States Patent
Nagasawa et al.

(10) Patent No.: US 12,785,643 B2
(45) Date of Patent: Nov. 3, 2026

(54) SSH CIRCUIT AND ELECTRONIC DEVICE

(71) Applicant: ROHM Co., LTD., Kyoto (JP)

(72) Inventors: Fumiya Nagasawa, Kyoto (JP); Kazuisao Tsuruda, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 355 days.

(21) Appl. No.: 18/413,268

(22) Filed: Jan. 16, 2024

(65) Prior Publication Data

US 2024/0243717 A1 Jul. 18, 2024

(30) Foreign Application Priority Data

Jan. 18, 2023 (JP) ................................ 2023-005933

(51) Int. Cl.

*H03H 7/01* (2006.01)
*H03H 9/00* (2006.01)
*H03H 17/02* (2006.01)
*H03H 21/00* (2006.01)

(52) U.S. Cl.

CPC .......... *H03H 7/0115* (2013.01); *H03H 9/009* (2013.01); *H03H 17/0285* (2013.01); *H03H 21/0014* (2013.01)

(58) Field of Classification Search

CPC ............. H03H 7/0115; H03H 17/0285; H03H 21/0014; H03H 9/009; H01P 1/2005
USPC ................................ 333/169, 175, 185, 190
See application file for complete search history.

(56) References Cited

FOREIGN PATENT DOCUMENTS

JP 2005302962 A * 10/2005

OTHER PUBLICATIONS

English Translation for JP2005302962 (Year: 2005).*

* cited by examiner

*Primary Examiner* — Rakesh B Patel
(74) *Attorney, Agent, or Firm* — CHIP Law Group

(57) ABSTRACT

An SSH circuit includes a plurality of unit lattices, each unit lattice including unit circuits. Each unit circuit includes two first inductors, a second inductor connected in series between the two first inductors, and two capacitors connected between a ground potential and two respective connection nodes at which the first and second inductors are connected to each other, an inductance of the second inductor being larger than that of the first inductors. In each unit lattice, the two connection nodes of each unit circuit are arranged at respective vertexes of both ends of each side forming a hyperrectangle, and the connection nodes arranged at each vertex being connected to each other and sharing the corresponding capacitor. The unit lattices are connected to each other by a mutual sharing of the first inductors by two unit lattices adjacent to each other. A peripheral edge has an uneven shape of unit lattices.

20 Claims, 19 Drawing Sheets

SSH CIRCUIT AND ELECTRONIC DEVICE

CROSS REFERENCE TO RELATED APPLICATIONS

This application claims priority benefit of Japanese Patent Application No. JP 2023-005933 filed in the Japan Patent Office on Jan. 18, 2023. Each of the above-referenced applications is hereby incorporated herein by reference in its entirety.

BACKGROUND

The present disclosure relates to an SSH circuit and an electronic device.

In a field of solid-state physics, substances having new properties attributable to geometric features (topology) in a real space or a momentum space have been found. Among these substances, a representative substance referred to as a topological insulator has unique properties in that an inside (bulk) thereof is an insulator that does not transmit a current but the substance transmits a current at edges (periphery and surface) thereof. The current flowing through the edges has robustness referred to as topological protection, and exhibits properties desirable in applications.

There is a Su-Schrieffer-Heeger (SSH) model as one of models that simply represent the topological insulator. The SSH model is a model in which atoms are alternately connected to each other by two kinds of different binding forces. Recently, it has been found out that this model can be realized also in an electronic circuit by replacing an atom with a ground capacitor and replacing an interatomic bond with an inductor. Such a circuit is referred to as an SSH circuit. It is indicated in S. Liu et al., Research 2019, U.S. Pat. No. 8,609,875 (2019) that, when inductors and capacitors as discrete parts are used, a current flows through the edges of the SSH circuit at a specific frequency, and a robust property is exhibited. In addition, it is indicated that, in the SSH circuit, a state of flowing at this specific frequency operates as a band-pass filter for a high-frequency signal.

Tsuyoshi Nakamura, Applied Statistics, Volume 9, Issue 2, p. 67, 1980 describes a method of analytically estimating the moment of a reciprocal of a random variable conforming to a normal distribution.

DETAILED DESCRIPTION

Figure 1:
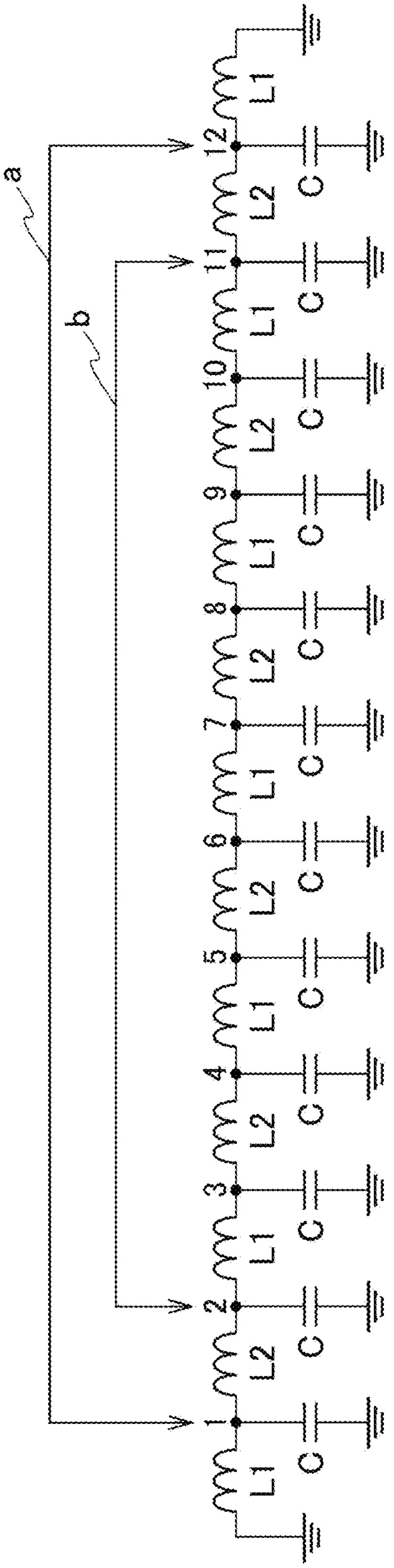
FIG. 1 is a circuit diagram illustrating an example of a one-dimensional SSH circuit.

Embodiments of an SSH circuit and an electronic device according to the present disclosure will hereinafter be described in detail with reference to the drawings. FIG. 1 is a circuit diagram illustrating an example of a one-dimensional SSH circuit. The example of the one-dimensional SSH circuit has 12 connection nodes from a first connection node to a twelfth connection node.

In the example of the one-dimensional SSH circuit, first inductors having 390 nH as a first inductance L1 and second inductors having 2200 nH as a second inductance L2 larger than the first inductance L1 are alternately connected to each other, and capacitors C having 10 nF as a predetermined capacitance C are each connected between a connection node connecting the first inductor and the second inductor adjacent to each other and a ground potential. Arms of the first inductors at both ends in the example of the one-dimensional SSH circuit which arms are on a side where there is no adjacent second inductor are grounded. Incidentally, in the following, for convenience, the first inductance L1, the second inductance L2, and the capacitance C are respectively used for the reference symbols of the first inductors, the second inductors, and the capacitors, and the first inductors, the second inductors, and the capacitors will be referred to as first inductors L1, second inductors L2, and capacitors C.

Figure 2:
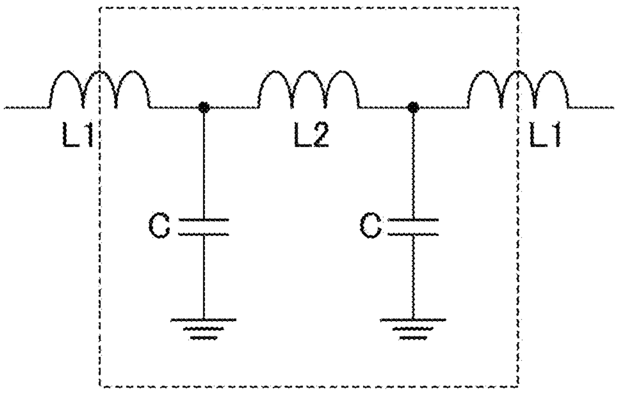
FIG. 2 is a circuit diagram illustrating a unit circuit constituting the example of the one-dimensional SSH circuit illustrated in FIG. 1.

FIG. 2 is a circuit diagram of a unit circuit constituting the example of the one-dimensional SSH circuit illustrated in FIG. 1. As illustrated in a range enclosed by a frame of a broken line in FIG. 2, the unit circuit includes two first inductors L1, a second inductor L2 connected in series between the two first inductors L1, and two capacitors C each connected between the ground potential and a connection node at which the corresponding first inductor L1 and the second inductor L2 are connected to each other. The second inductance L2 of the second inductor L2 is larger than the first inductance L1 of the first inductors L1. That is, L1<L2.

The example of the one-dimensional SSH circuit illustrated in FIG. 1 includes the unit circuit illustrated in FIG. 2. Specifically, unit circuits are combined with each other in a direction in which the one-dimensional SSH circuit extends, in such a manner that the first inductances L1 and the second inductances L2 are alternately connected to each other at the connection nodes. First inductors L1 that are present at both ends of the one-dimensional SSH circuit and to which there is no second inductor L2 to be connected are grounded.

Figure 3:
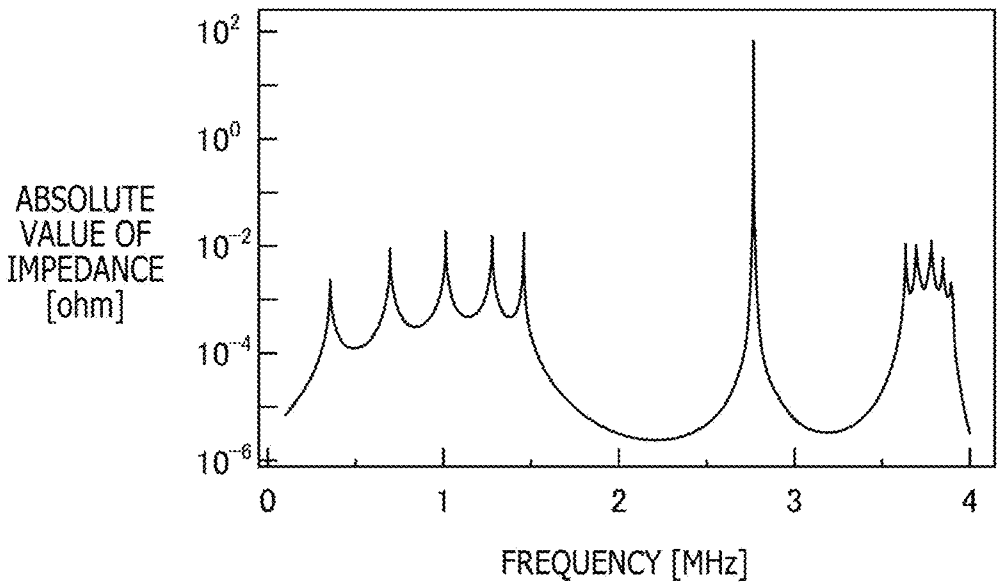
FIG. 3 is a graph illustrating a result of simulation of frequency characteristics between connection nodes at both ends in the example of the one-dimensional SSH circuit illustrated in FIG. 1.

FIG. 3 is a graph illustrating a result of simulation of frequency characteristics between the connection nodes at both ends in the example of the one-dimensional SSH circuit illustrated in FIG. 1. In FIG. 1, a range between the first connection node and the twelfth connection node at both ends is indicated by reference symbol "a." The graph of FIG. 3 illustrates the dependence of the absolute value of inter-node impedance on frequency.

As illustrated in FIG. 3, in the frequency characteristics between the connection nodes at both ends of the example of the one-dimensional SSH circuit, a sharp peak is observed to rise between a frequency of 25 MHz and a frequency of 30 MHz in a band of low transmittivity from a frequency of approximately 15 MHz to a frequency of approximately 35 MHz. Hence, it is conceivable that the one-dimensional SSH circuit is applied to a band-pass filter. Such frequency characteristics between the connection nodes at both ends are brought about by an edge mode to be described later in which a potential standing wave is localized at both ends of the one-dimensional SSH circuit.

Figure 4:
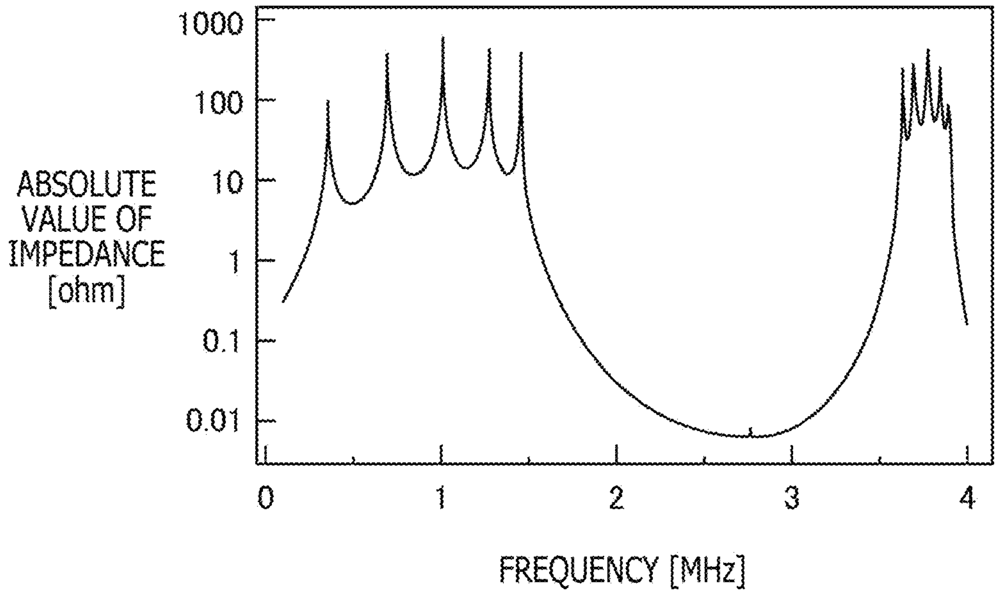
FIG. 4 is a graph illustrating a result of simulation of frequency characteristics between connection nodes immediately inward of both ends in the example of the one-dimensional SSH circuit illustrated in FIG. 1.

FIG. 4 is a graph illustrating a result of simulation of frequency characteristics between connection nodes immediately inward of both ends in the example of the one-dimensional SSH circuit illustrated in FIG. 1. In the example of the one-dimensional SSH circuit, a range between a second connection node and an eleventh connection node immediately inward of both ends is indicated by reference symbol "b." The graph of FIG. 4 also illustrates the dependence of the absolute value of inter-node impedance on frequency.

As illustrated in FIG. 4, in the frequency characteristics between the connection nodes immediately inward of both ends of the example of the one-dimensional SSH circuit, a band of low transmittivity from a frequency of approximately 15 MHz to a frequency of approximately 35 MHz was formed, but no conspicuous peak was present in this band of low transmittivity. Such frequency characteristics between the connection nodes immediately inward of both ends are brought about by a bulk mode to be described later in which a potential standing wave is distributed over the whole of the one-dimensional SSH circuit.

Figure 5:
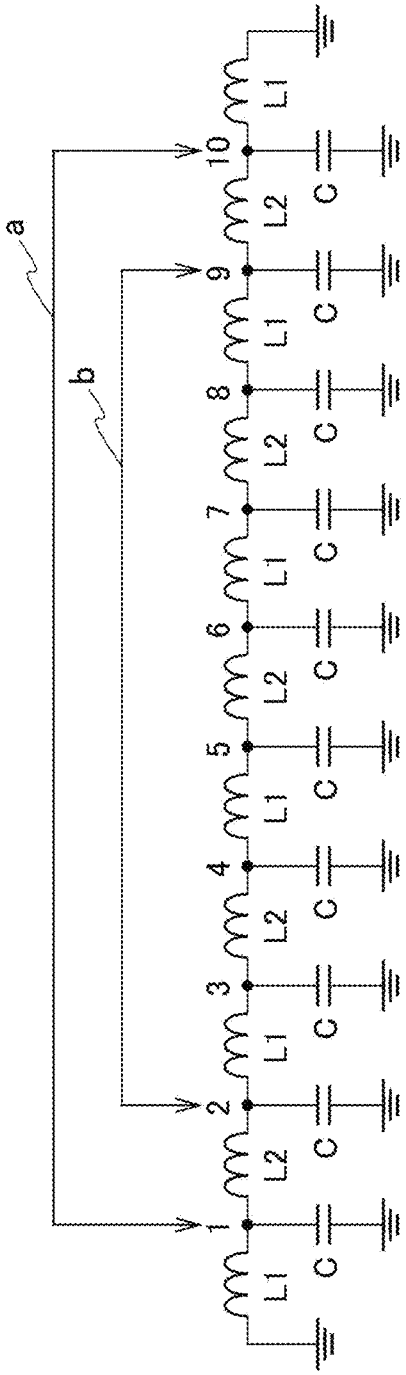
FIG. 5 is a circuit diagram illustrating another example of the one-dimensional SSH circuit.

FIG. 5 is a circuit diagram illustrating another example of the one-dimensional SSH circuit. The other example of the one-dimensional SSH circuit is different from the example of the one-dimensional SSH circuit as illustrated in FIG. 1 which example has the 12 connection nodes, in that the other example of the one-dimensional SSH circuit has 10 connection nodes from a first connection node to a tenth connection node. In the other example of the one-dimensional SSH circuit, the first inductance L1 is set at 39 nH, the second inductance L2 is set at 220 nH, and the capacitance C is set at 1 nF.

Figure 6:
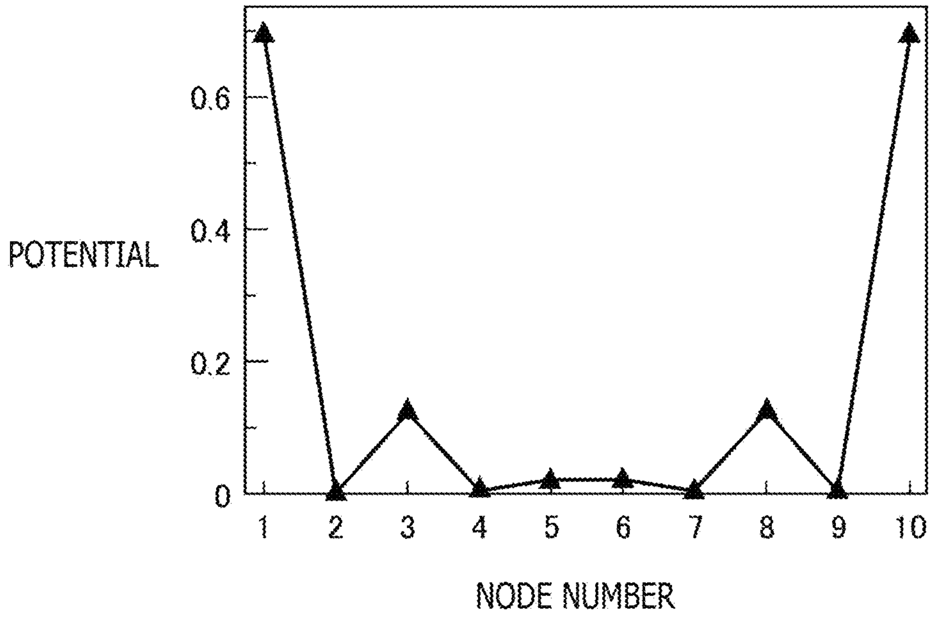
FIG. 6 is a graph illustrating a potential distribution of an edge mode in the other example of the one-dimensional SSH circuit illustrated in FIG. 5.

FIG. 6 is a graph illustrating a potential distribution of the edge mode in the other example of the one-dimensional SSH circuit. The magnitude of potential is in freely selected units. In the case of the potential distribution of the edge mode, natural frequencies and corresponding potential standing waves were determined by denoting Kirchhoff's current law in an admittance matrix for each connection node in the other example of the one-dimensional SSH circuit and performing diagonalization, and from among the natural frequencies and the corresponding potential standing waves, an appropriate natural frequency and an appropriate potential standing wave corresponding to the edge mode were obtained. For example, a lowest natural frequency and a corresponding standing wave belonging to the edge mode may be obtained. In the edge mode, it is observed that potential standing waves are localized at the first connection node and the tenth connection node of both ends, and that the potentials of the second to ninth intermediate connection nodes excluding both ends are kept low.

Figure 7:
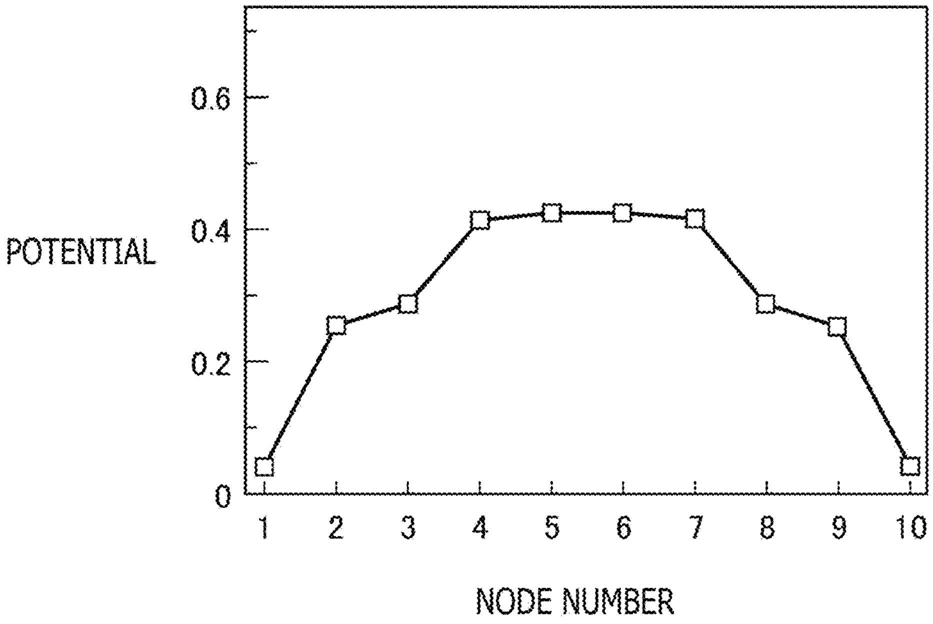
FIG. 7 is a graph illustrating a potential distribution of a bulk mode in the other example of the one-dimensional SSH circuit illustrated in FIG. 5.

FIG. 7 is a graph illustrating a potential distribution of the bulk mode in the other example of the one-dimensional SSH circuit illustrated in FIG. 5. The magnitude of potential is in freely selected units. Also in the case of the potential distribution of the bulk mode, natural frequencies and corresponding potential standing waves were determined by denoting Kirchhoff's current law in an admittance matrix for each connection node in the other example of the one-dimensional SSH circuit and performing diagonalization, and from among the natural frequencies and the corresponding potential standing waves, an appropriate natural frequency and an appropriate potential standing wave corresponding to the bulk mode were obtained. For example, a lowest natural frequency and a corresponding standing wave belonging to the bulk mode may be obtained. In the bulk mode, the potential is distributed to the whole of the first to tenth connection nodes. Specifically, it is observed that the potential is gradually raised toward inner connection nodes from the first connection node and the tenth connection node of both ends and is highest at the fifth connection node and the sixth connection node in a center.

Figure 8:
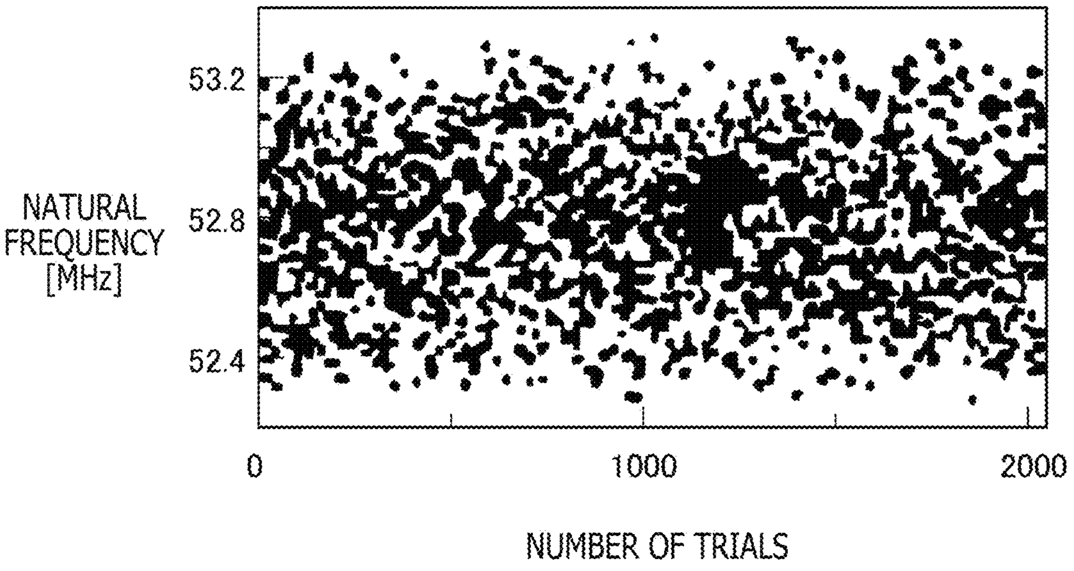
FIG. 8 is a graph illustrating a result of simulation of a distribution of natural frequencies of the edge mode in the other example of the one-dimensional SSH circuit illustrated in FIG. 5.

FIG. 8 is a graph illustrating a result of simulation of natural frequencies of the edge mode in consideration of characteristic variations of elements in the other example of the one-dimensional SSH circuit illustrated in FIG. 5. In the simulation, 2048 trials were performed supposing that the values of the respective elements of the first inductors L1, the second inductors L2, and the capacitors C constituting the other example of the one-dimensional SSH circuit had a uniform distribution with a variation range of ±1%. In the following, such variations in the values of the respective elements may be referred to as characteristic variations. In each trial, as described earlier, an admittance matrix was diagonalized, and natural frequencies corresponding to the edge mode were obtained.

Figure 9:
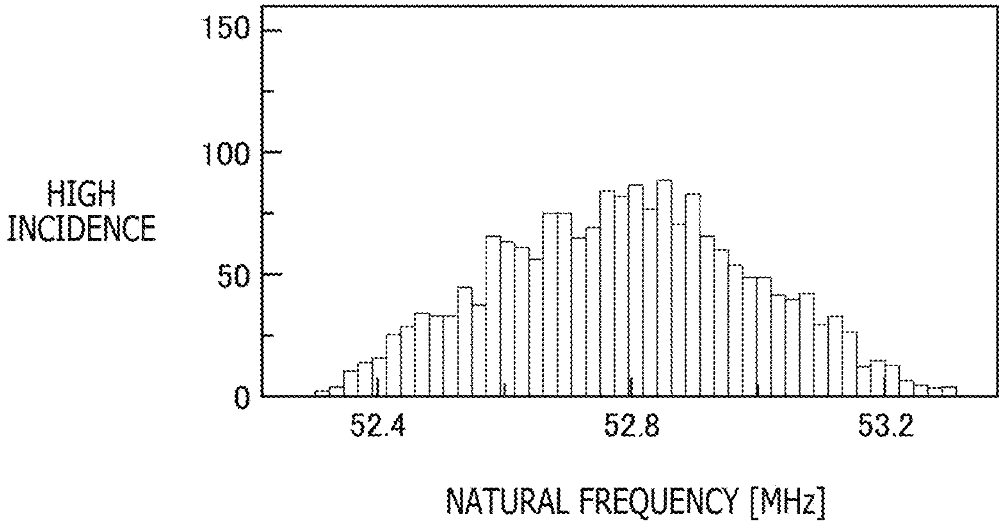
FIG. 9 is a graph representing, by high incidence, the result of simulation of the distribution of the natural frequencies of the edge mode in FIG. 8.

FIG. 9 is a graph representing, by high incidence, a result of simulation of a distribution of the natural frequencies of the edge mode in FIG. 8. An average $\mu$ was 52.8 MHz, a standard deviation $\sigma$ was 0.203 MHz, and a variation coefficient $\sigma/\mu$ was 0.39%.

Figure 10:
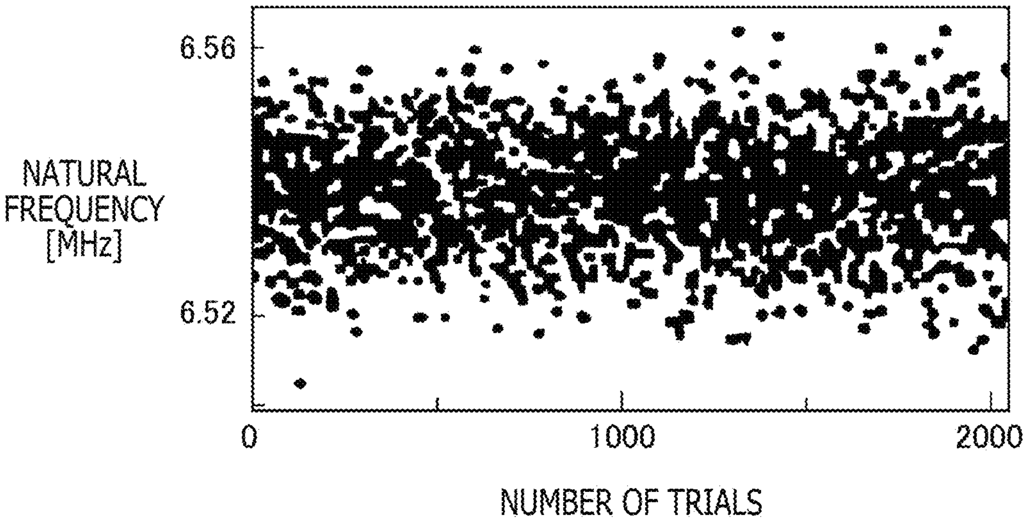
FIG. 10 is a graph illustrating a result of simulation of a distribution of natural frequencies of the bulk mode in the other example of the one-dimensional SSH circuit illustrated in FIG. 5.

FIG. 10 is a graph illustrating a result of simulation of natural frequencies of the bulk mode in consideration of characteristic variations of elements in the other example of the one-dimensional SSH circuit illustrated in FIG. 5. In the simulation, as in the simulation of the edge mode illustrated in FIG. 8, 2048 trials were performed supposing that the values of the respective elements constituting the other example of the one-dimensional SSH circuit had a uniform distribution with a characteristic variation range of ±1%. In each trial, as described earlier, an admittance matrix was diagonalized, and natural frequencies corresponding to the bulk mode were obtained.

Figure 11:
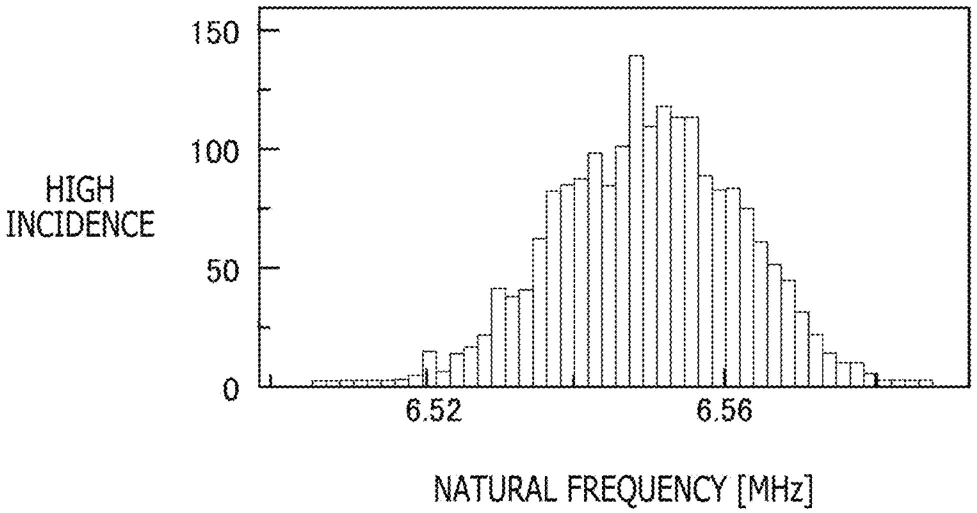
FIG. 11 is a graph illustrating, by high incidence, the result of simulation of the distribution of the natural frequencies of the bulk mode in FIG. 10.

FIG. 11 is a graph illustrating, by high incidence, a result of simulation of a distribution of the natural frequencies of the bulk mode in FIG. 10. An average $\mu$ of the natural frequencies was 6.55 MHZ, a standard deviation $\sigma$ was $1.19\times10^{-2}$ MHz, and a variation coefficient $\sigma/\mu$ was 0.18%.

Figure 12:
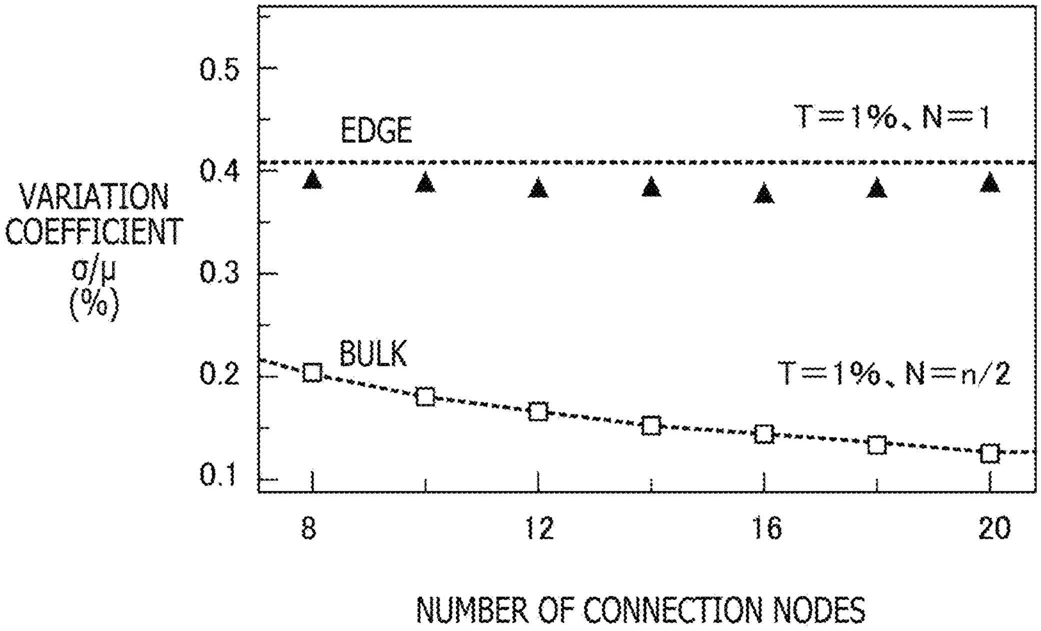
FIG. 12 is a graph illustrating a result of simulation of the dependence of a variation coefficient of natural frequencies on a circuit scale in the one-dimensional SSH circuit.

FIG. 12 is a graph illustrating a result of simulation of the dependence of the variation coefficient of the natural frequencies on a circuit scale in the other example of the one-dimensional SSH circuit illustrated in FIG. 5. When the circuit scale is defined by the number of connection nodes, the number of connection nodes in the example of the one-dimensional SSH circuit illustrated in FIG. 1, for example, is 12, and the number of connection nodes in the other example of the one-dimensional SSH circuit illustrated in FIG. 5 is 10. Also in the simulation of the dependence of the variation coefficient of the natural frequencies on the circuit scale, as in the simulation results illustrated in FIGS. 8 to 11, 2048 trials were performed for each of the numbers of connection nodes from 8 to 20, supposing that the values of the respective elements have a uniform distribution with a variation range of ±1%.

Triangles "▲" in FIG. 12 represent data on a result of simulation of the edge mode, and quadrangles "□" represent data on a result of simulation of the bulk mode. As a result of the simulation, in a range in which the number of connection nodes was 8 to 20, the variation coefficient of the natural frequencies in the edge mode was substantially constant irrespective of the number of connection nodes. On the other hand, the variation coefficient of the natural frequencies in the bulk mode was smaller than in the edge mode and gradually decreased as the number of connection nodes was increased. Incidentally, a curve in FIG. 12 represents values based on an analytically derived Equation (2) to be described later.

Figure 13:
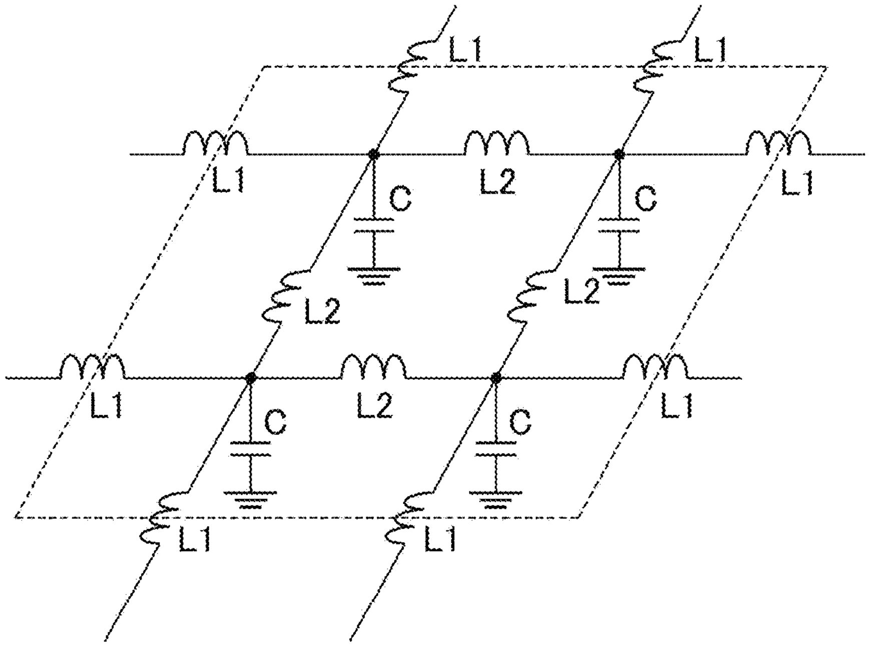
FIG. 13 is a bird's-eye view illustrating a two-dimensional unit lattice constituting a two-dimensional SSH circuit.

FIG. 13 is a bird's-eye view illustrating a two-dimensional unit lattice constituting a two-dimensional SSH circuit. As indicated by a range enclosed by a frame of a broken line in FIG. 13, the two-dimensional unit lattice includes four unit circuits, the two connection nodes possessed by each of the four unit circuits are arranged at respective vertexes of both ends of each side of a rectangle, and the connection nodes arranged at each vertex of the rectangle are connected to each other and share a capacitor C between the connection nodes and the ground potential.

Such two-dimensional unit lattices are connected to each other by a mutual sharing of first inductors L1 by two two-dimensional unit lattices adjacent to each other. First inductors L1 that are included in two-dimensional unit lattices disposed at peripheral edges of the two-dimensional SSH circuit and that are not shared are grounded.

Figure 14:
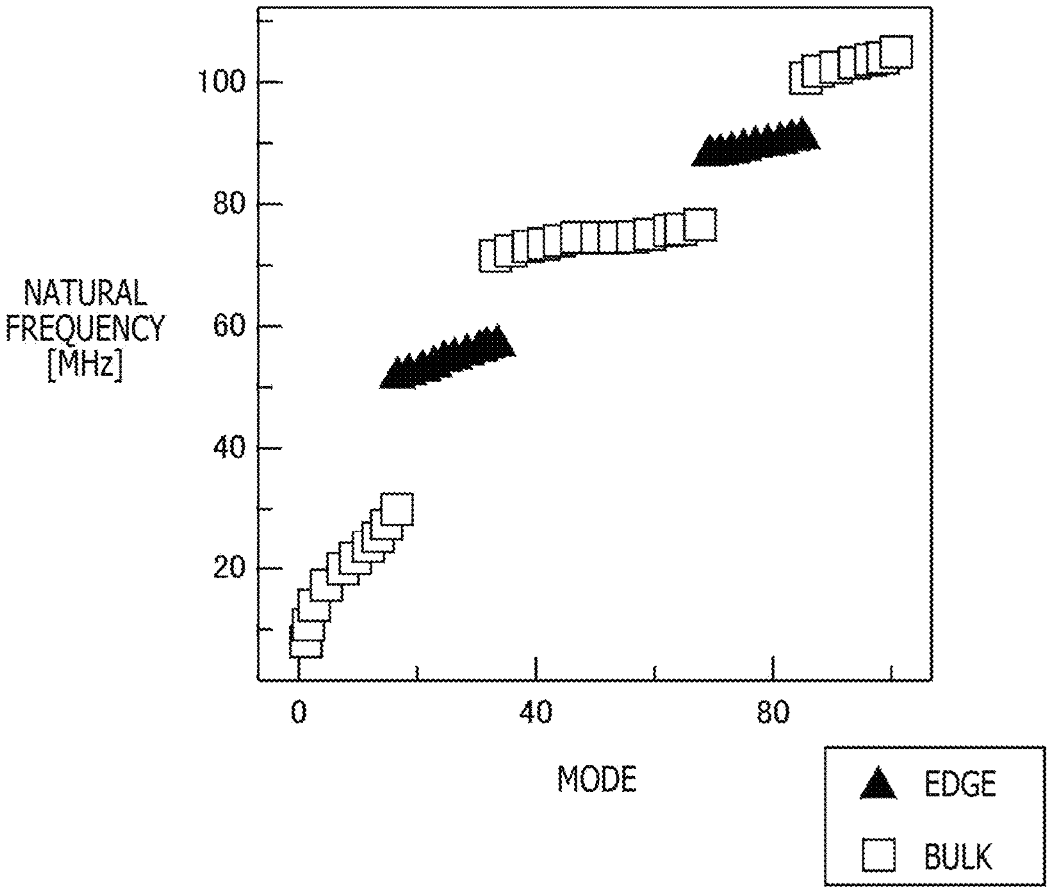
FIG. 14 is a graph illustrating natural frequencies in the two-dimensional SSH circuit.

FIG. 14 is a graph illustrating the natural frequencies of the two-dimensional SSH circuit. Assumed in the following is a two-dimensional SSH circuit in which two-dimensional unit lattices as illustrated in FIG. 13 are connected to each other in a first direction and a second direction in a two-dimensional plane and which has 10 connection nodes in each of the first direction and the second direction. Also in this two-dimensional SSH circuit, as in the other example of the one-dimensional SSH circuit illustrated in FIG. 5, the first inductance L1 is set at 39 nH, the second inductance L2 is set at 220 nH, and the capacitance C is set at 1 nF.

Also for the natural frequencies of the two-dimensional SSH circuit, as in the case of obtaining the potential of the standing waves in FIG. 6 and FIG. 7, the natural frequencies and corresponding potential standing waves were determined by denoting Kirchhoff's current law in an admittance matrix for each connection node of the two-dimensional SSH circuit and performing diagonalization. In FIG. 14, the natural frequencies of the respective modes are arranged in ascending order. Triangles "▲" represent the edge mode, and quadrangles "□" represent the bulk mode. It is observed in FIG. 14 that a band of natural frequencies is divided into bands in which the natural frequencies of the edge mode gather and bands in which the natural frequencies of the bulk mode gather, and that gaps are present between the bands in which the natural frequencies of the edge mode gather and the bands in which the natural frequencies of the bulk mode gather.

Figure 15:
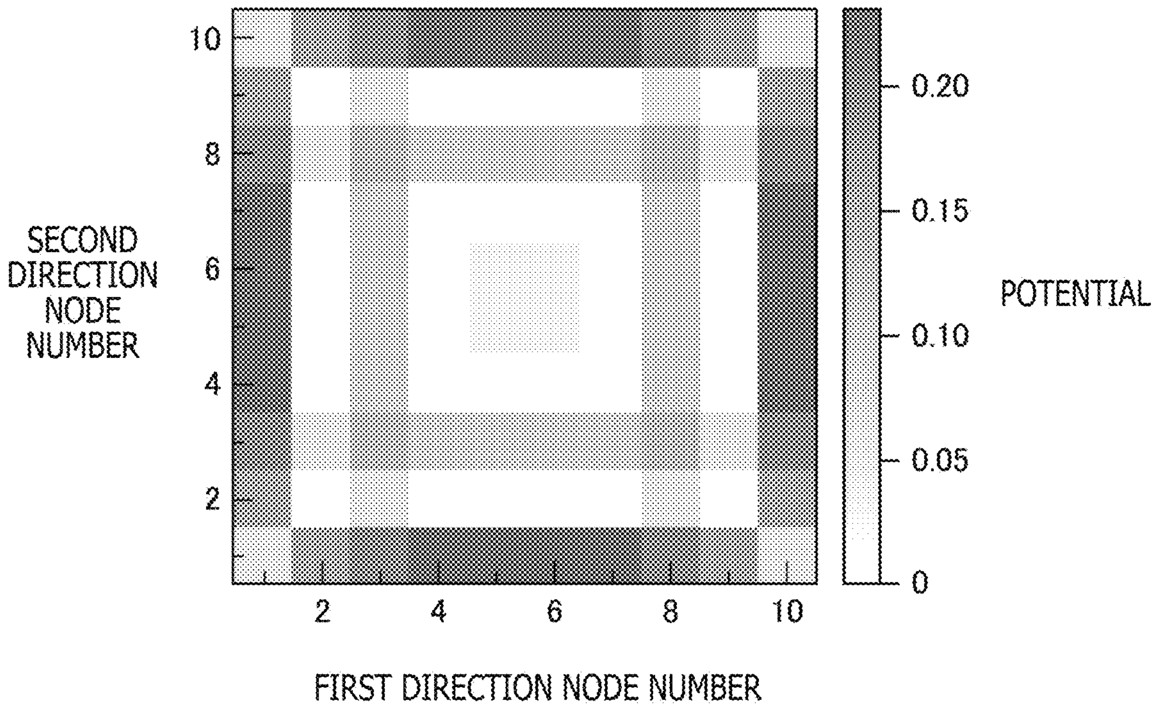
FIG. 15 is a diagram illustrating a potential distribution of the edge mode in the two-dimensional SSH circuit.

FIG. 15 is a diagram illustrating a potential distribution of the edge mode in the two-dimensional SSH circuit. This potential distribution is obtained as standing waves corresponding to natural frequencies by diagonalizing the admittance matrix of the two-dimensional SSH circuit described earlier. It is observed that, in the edge mode, potential standing waves are localized at connection nodes at the peripheral edges of the two-dimensional SSH circuit and the potentials of connection nodes in an inner part of the two-dimensional SSH circuit are kept low.

Figure 16:
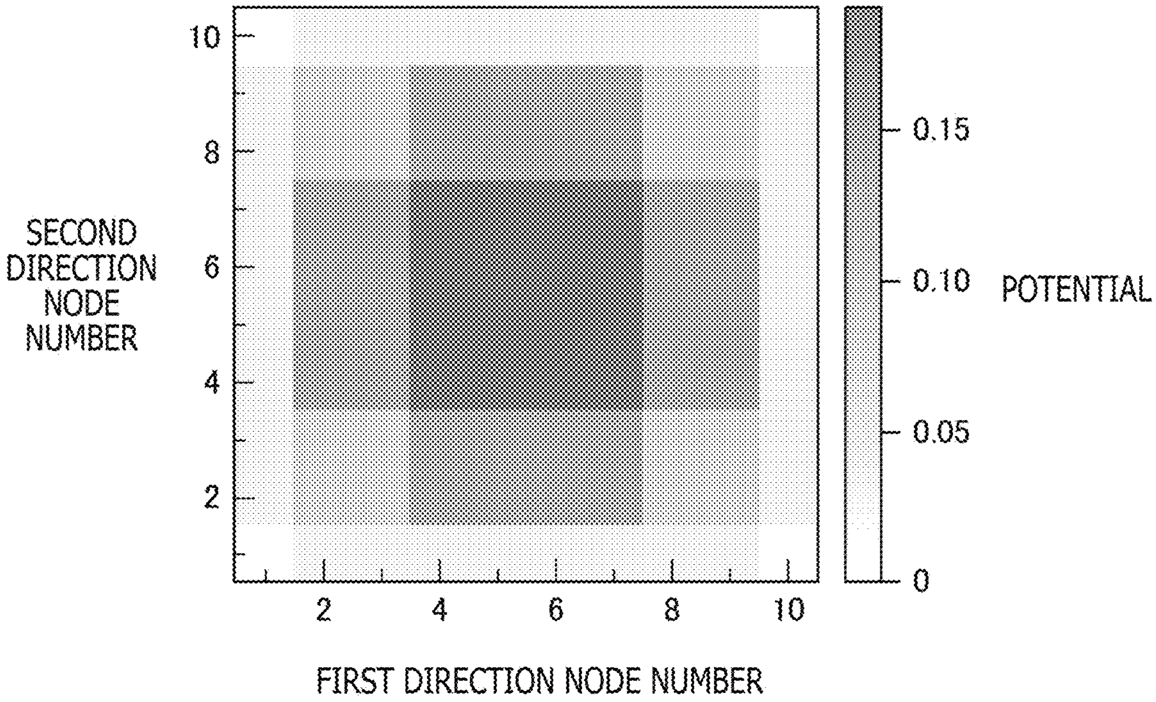
FIG. 16 is a diagram illustrating a potential distribution of the bulk mode in the two-dimensional SSH circuit.

FIG. 16 is a diagram illustrating a potential distribution of the bulk mode in the two-dimensional SSH circuit. This potential distribution is also obtained as standing waves corresponding to natural frequencies by diagonalizing the admittance matrix of the two-dimensional SSH circuit described earlier. It is observed that, in the bulk mode, potential standing waves are distributed to the whole of the two-dimensional SSH circuit and the potential becomes gradually higher toward the inner part from the peripheral edges.

Figure 17:
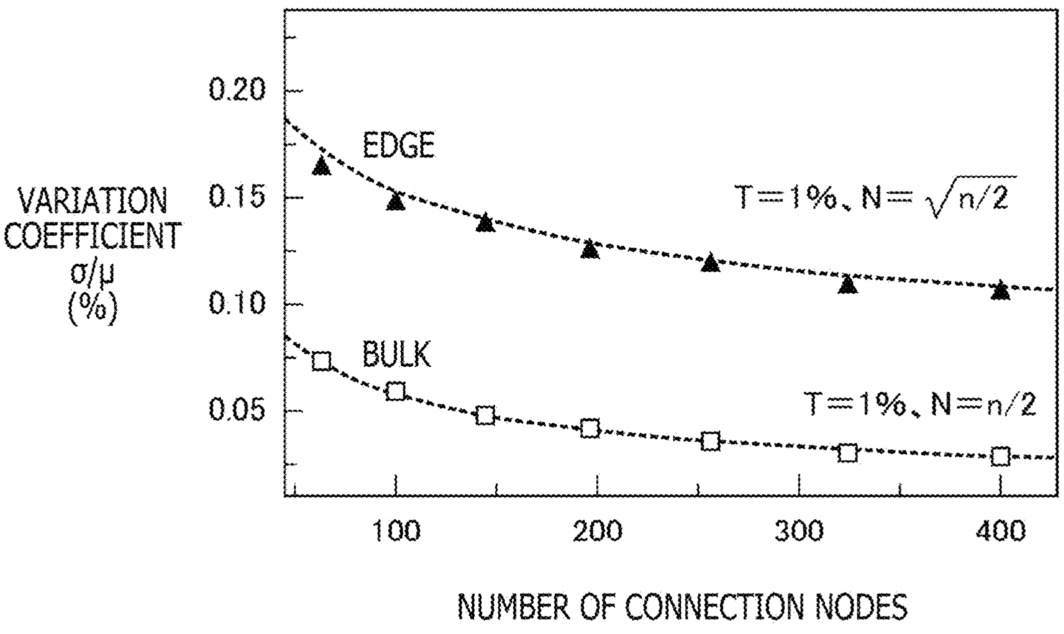
FIG. 17 is a graph illustrating a result of simulation of the dependence of the variation coefficient of the natural frequencies on a circuit scale in the two-dimensional SSH circuit.

FIG. 17 is a graph illustrating a result of simulation of the dependence of the variation coefficient of the natural frequencies on a circuit scale in the two-dimensional SSH circuit. When the circuit scale is defined by the number of connection nodes, the two-dimensional SSH circuit whose potential distributions are illustrated in FIG. 15 and FIG. 16, for example, has 10×10, or 100, connection nodes in the first direction and the second direction. In the simulation of the dependence of the variation coefficient of the natural frequencies on the circuit scale, as in the simulation result of the other example of the one-dimensional SSH circuit illustrated in FIG. 12, 2048 trials were performed for each of the numbers of connection nodes from 8×8, or 64, to 20×20, or 400, in the first direction and the second direction, supposing that the values of the respective elements have a uniform distribution with a characteristic variation range of ±1%.

In FIG. 17, triangles "▲" represent data on a result of simulation of the edge mode, and quadrangles "□" represent data on a result of simulation of the bulk mode. As a result of the simulation, in a range in which the number of connection nodes was 8×8 to 20×20, the variation coefficient of the natural frequencies in the bulk mode was smaller than in the edge mode, and the variation coefficients of the natural frequencies in both the edge mode and the bulk mode gradually decreased as the number of connection nodes was increased. Incidentally, curves in FIG. 17 are values based on an analytically derived Equation (2) to be described later.

Next, the results of simulation of the dependence of the variation coefficient of the natural frequencies on the circuit scale in the other example of the one-dimensional SSH circuit and the two-dimensional SSH circuit, the simulation results being illustrated in FIG. 12 and FIG. 17, respectively, are verified by using relational expressions analytically obtained supposing that the SSH circuits are ladder circuits of LC circuits.

Supposing that the inductance L of an inductor and the capacitance C of a capacitor in an LC circuit are random variables conforming to a normal distribution, the variance of a resonance frequency of the LC circuit is given by Equation (1). [Math. 1]

$$V\left(\frac{1}{2\pi\sqrt{LC}}\right) \tag{1}$$

Starting from Equation (1), and supposing that the random variables L and C both have a same tolerance such as ±1% of a uniform distribution, that is, variations of 0.01, for example, Equation (2) is obtained which relates a variation coefficient σ/μ of the natural frequencies of the SSH circuit, a number N of LC circuits, and a variation T to each other. The circuit scale of the SSH circuit is defined by the number N of LC circuits as constituent elements. Therefore, Equation (2) can also be said to be an equation that relates the variation coefficient of the natural frequencies of the SSH circuit and the circuit scale to each other. Incidentally, Tsuyoshi Nakamura, Applied Statistics, Volume 9, Issue 2, p. 67, 1980 was referred to in a process of deriving Equation (2).

[Math. 2]

$$\frac{\sigma}{\mu} = \frac{\sqrt{V\left(\frac{1}{2\pi\sqrt{LC}}\right)_N}}{E\left(\frac{1}{2\pi\sqrt{LC}}\right)_N} = \frac{T}{\sqrt{6N}} \tag{2}$$

Here, in Equation (2),

[Math. 3]

$$E\left(\frac{1}{2\pi\sqrt{LC}}\right)_N$$

is an average of the resonance frequencies of the N LC circuits corresponding to the natural frequencies of the SSH circuit, and

[Math. 4]

$$\sqrt{V\left(\frac{1}{2\pi\sqrt{LC}}\right)_N}$$

is a standard deviation.

Equation (2) that relates the variation coefficient of the natural frequencies and the circuit scale of the SSH circuit to each other is applied to such a one-dimensional SSH circuit as the other example of the one-dimensional SSH circuit illustrated in FIG. 5. Supposing that one LC circuit corresponds to one unit circuit in the one-dimensional SSH circuit, one LC circuit corresponds to two connection nodes. In the edge mode, standing waves are localized at the connection nodes of both ends of the one-dimensional SSH circuit, and therefore, the number N of LC circuits corresponding to the two connection nodes of both ends is 1. In the bulk mode, standing waves are distributed to the whole of the one-dimensional SSH circuit, and therefore, the number of LC circuits corresponding to n connection nodes is n/2. The variation T in the random variables L and C was set at 1% of a uniform distribution as in the simulation of the other example of the one-dimensional SSH circuit, the result of the simulation being illustrated in FIG. 12.

In the graph illustrating the result of simulation of the dependence of the variation coefficient of the natural frequencies on the circuit scale of the one-dimensional SSH circuit, the graph being illustrated in FIG. 12, the value of Equation (2) that relates the variation coefficient of the natural frequencies and the circuit scale of the SSH circuit to each other is depicted by a curve. It is observed in FIG. 12 that the value of Equation (2) matches well with data based on the simulation in both the edge mode and the bulk mode.

It is observed in FIG. 12 that, in the edge mode, the variation coefficient does not depend on the circuit scale. This is considered to be because, in the edge mode, standing waves are localized at both ends of the one-dimensional SSH circuit, and the distribution of the standing waves is zero-dimensional, so that there is no effect of suppressing the variation coefficient of the natural frequencies by an increase in the number of connection nodes.

On the other hand, it is observed that, in the bulk mode, the variation coefficient of the natural frequencies gradually decreases according to the circuit scale. This is considered to be because standing waves are distributed to the whole of the one-dimensional SSH circuit, and the distribution of the standing waves is one-dimensional, so that the variation coefficient of the natural frequencies is suppressed by an increase in the number of connection nodes. In reference to Equation (2), as the number N of connection nodes as the circuit scale is increased, the variation coefficient of the natural frequencies in the bulk mode decreases in proportion to

[Math. 5]

$$\frac{1}{\sqrt{\frac{n}{2}}}$$

Equation (2) that relates the variation coefficient of the natural frequencies of the SSH circuit and the circuit scale of the SSH circuit to each other was applied also to the two-dimensional SSH circuit whose unit lattice is illustrated in FIG. 13. Supposing that one LC circuit corresponds to one unit circuit also in the two-dimensional SSH circuit, one LC circuit corresponds to two connection nodes. In the edge mode, standing waves are localized at peripheral edges as edges, and therefore, the number of LC circuits corresponding to the connection nodes of the peripheral edges was set at $$\sqrt{\frac{n}{2}} \quad \text{[Math. 6]}$$

In the bulk mode, standing waves are distributed to the whole of the two-dimensional SSH circuit, and therefore, the number of LC circuits corresponding to n connection nodes possessed by the two-dimensional SSH circuit was set at n/2. The variation T in the random variables L and C was set at 1% of a uniform distribution as in the simulation of the other example of the two-dimensional SSH circuit, the result of the simulation being illustrated in FIG. 17.

In the graph illustrating the result of the simulation of the dependence of the variation coefficient of the natural frequencies on the circuit scale of the one-dimensional SSH circuit, the graph being illustrated in FIG. 17, the value of Equation (2) that relates the variation coefficient of the natural frequencies and the circuit scale of the SSH circuit to each other is depicted by curves. It is observed also in FIG. 17 that the value of Equation (2) matches well with data based on the simulation in both the edge mode and the bulk mode.

It is observed in FIG. 17 that the variation coefficient of the natural frequencies gradually decreases according to the circuit scale in both the edge mode and the bulk mode. This is considered to be because, in the edge mode, standing waves are localized at peripheral edges forming edges in the two-dimensional SSH circuit, and the distribution of the standing waves is one-dimensional, so that the variation coefficient of the natural frequencies is suppressed by an increase in the number of connection nodes. In reference to Equation (2), as the number n of connection nodes is increased, the variation coefficient of the natural frequencies in the edge mode decreases in proportion to $$\frac{1}{\left(\frac{n}{2}\right)^{\frac{1}{4}}} \quad \text{[Math. 7]}$$

It is considered to be because, in the bulk mode, standing waves are distributed to the whole of the two-dimensional SSH circuit, and the distribution of the standing waves is two-dimensional, so that the variation coefficient of the natural frequencies is suppressed by an increase in the number of connection nodes. In reference to Equation (2), as the number n of connection nodes is increased, the variation coefficient of the natural frequencies in the bulk mode decreases in proportion to $$\frac{1}{\sqrt{\frac{n}{2}}} \quad \text{[Math. 8]}$$

The variation coefficient of the natural frequencies in the edge mode of the two-dimensional SSH circuit can be suppressed by using such characteristics of the two-dimensional SSH circuit. For example, the variation coefficient of the natural frequencies can be suppressed by extending the path of a peripheral edge forming an edge. Specifically, an uneven section of two-dimensional unit lattices constituting the two-dimensional SSH circuit is formed along the peripheral edge of the two-dimensional SSH circuit. The number of two-dimensional unit lattices and elements constituting the two-dimensional unit lattices is increased by forming the uneven section. The variation coefficient of the natural frequencies in the edge mode can be suppressed by canceling out characteristic variations between the elements. A configuration in which an uneven section of two-dimensional unit lattices is thus formed along a peripheral edge of the two-dimensional SSH circuit will be described in a first embodiment to be described later.

In addition, the variation coefficient of the natural frequencies of the two-dimensional SSH circuit can be suppressed by forming the unit lattices of the peripheral edge forming the edge of the two-dimensional SSH circuit, from elements having small characteristic variations. Characteristic variations of the elements constituting the unit lattices of the peripheral edge of the two-dimensional SSH circuit greatly contribute to the natural frequencies in the edge mode. Hence, the variation coefficient of the natural frequencies in the edge mode can be suppressed by reducing the characteristic variations of the elements forming the circuit elements of the peripheral edge. A configuration that reduces the characteristic variations of the elements constituting the two-dimensional SSH circuit will be described in a second embodiment to be described later.

Figure 18:
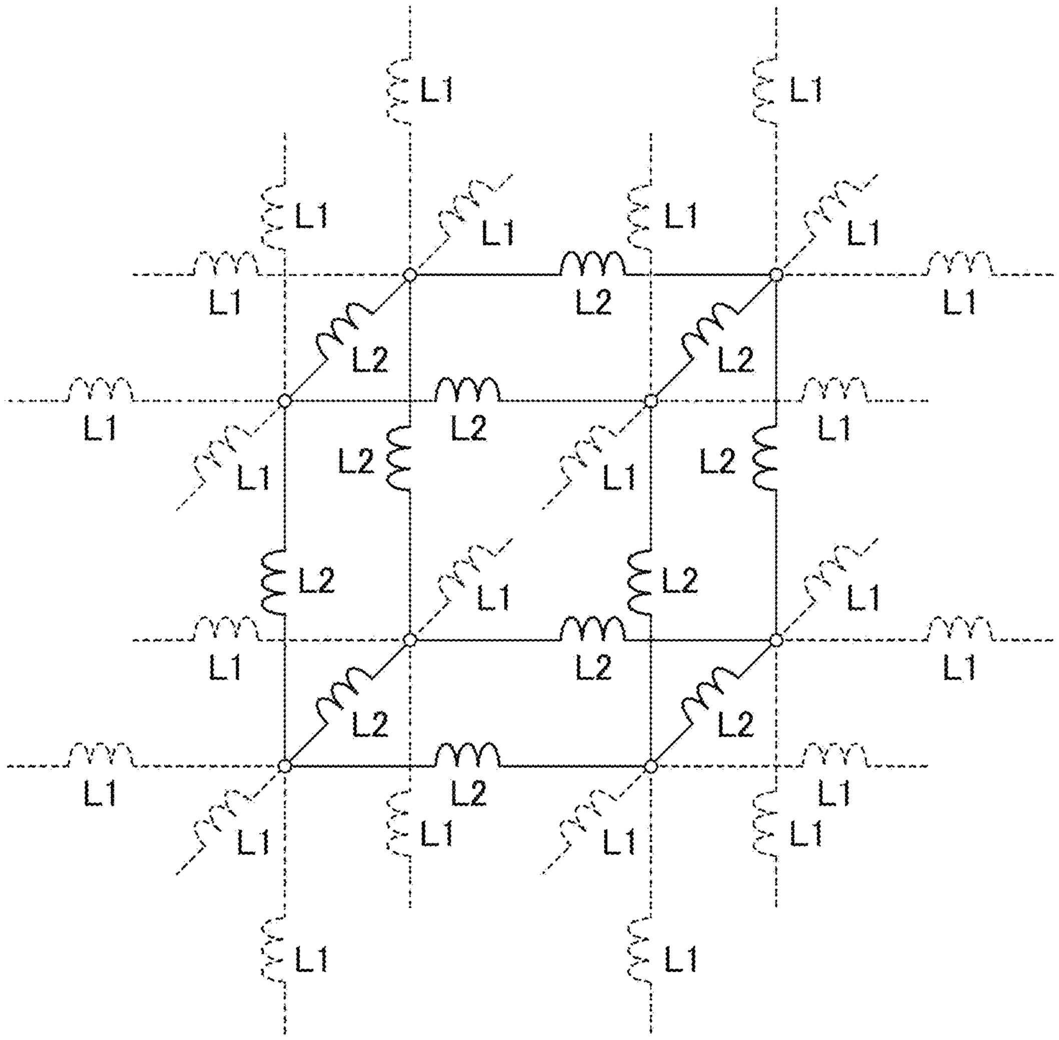
FIG. 18 is a bird's-eye view illustrating a three-dimensional unit lattice constituting a three-dimensional SSH circuit.

FIG. 18 is a bird's-eye view illustrating a three-dimensional unit lattice constituting a three-dimensional SSH circuit. The three-dimensional unit lattice includes 12 unit circuits, the two connection nodes possessed by each of the 12 unit circuits are arranged at respective vertexes of both ends of each side of a rectangular parallelepiped, and the connection nodes arranged at each vertex of the rectangular parallelepiped are connected to each other and share a capacitor C between the connection nodes and the ground potential. Incidentally, in FIG. 18, capacitors C between the connection nodes indicated by circles "o" and the ground potential are not illustrated.

Such three-dimensional unit lattices are connected to each other by a mutual sharing of first inductors L1 by two three-dimensional unit lattices adjacent to each other. First inductors L1 that are included in three-dimensional unit lattices disposed at peripheral edges of the three-dimensional SSH circuit and that are not shared are grounded.

Also in the three-dimensional SSH circuit, as in the one-dimensional SSH model and the two-dimensional SSH model, a difference in behavior between the edge mode and the bulk mode is understood from the dimensionality of a standing wave distribution in each mode. In the three-dimensional SSH circuit, standing waves are distributed two-dimensionally in the edge mode and three-dimensionally in the bulk mode. Hence, it is assumed that, also in the three-dimensional SSH circuit, the variation coefficient of the natural frequencies is suppressed with an increase in the circuit scale in both the edge mode and the bulk mode.

Therefore, it is assumed that, as in the two-dimensional SSH circuit described above, the variation coefficient of the natural frequencies is suppressed by forming an uneven section of three-dimensional unit lattices at a peripheral edge of the three-dimensional SSH circuit, or reducing characteristic variations of elements constituting the three-dimensional unit lattices at the peripheral edge. For the three-dimensional SSH circuit, a configuration in which the uneven section of the three-dimensional unit lattices at the peripheral edge is formed will be described as a modification of the first embodiment to be described later, and a configuration that reduces the characteristic variations of the elements constituting the three-dimensional unit lattices at the peripheral edge will be described as a modification of the second embodiment to be described later.

As illustrated as the frequency characteristics of the example of the one-dimensional SSH circuit in FIG. 3, the SSH circuit has a sharp peak in a band of low transmittivity in the edge mode, and can therefore be used as a band-pass filter. In the two-dimensional and three-dimensional SSH circuits, by suppressing the variation coefficient of the natural frequencies in the edge mode as described earlier, it is possible to improve the frequency stability of the SSH circuits and to ensure the characteristics of band-pass filters including the SSH circuits.

The two-dimensional SSH circuit may be formed on a surface of a board, and the two-dimensional SSH circuit and the board may be provided as an integral electronic device. In addition, the three-dimensional SSH circuit may be formed at least within a board, and the three-dimensional SSH circuit and the board may be provided as an integral electronic device. Also in such an electronic device, it is possible to ensure the characteristics of a band-pass filter of the SSH circuit included in the electronic device, by suppressing the variation coefficient of the natural frequencies in the edge mode of the two-dimensional or three-dimensional SSH circuit and improving the frequency stability of the SSH circuit.

First Embodiment

Figure 19:
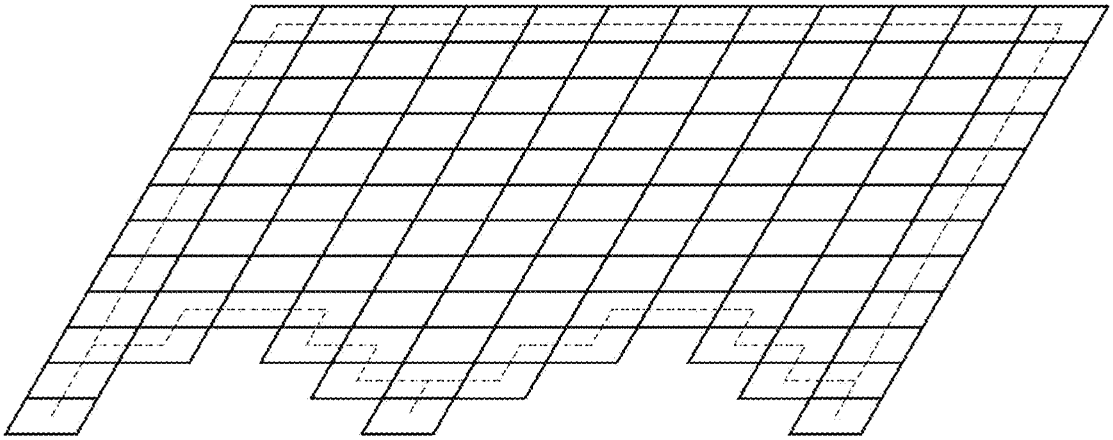
FIG. 19 is a bird's-eye view illustrating an arrangement of unit lattices in an SSH circuit according to a first embodiment.

FIG. 19 is a bird's-eye view illustrating an arrangement of unit lattices in an SSH circuit in a first embodiment. The first embodiment is a two-dimensional SSH circuit that has a rectangular external shape and in which an uneven shape of two-dimensional unit lattices is formed on one side of the rectangular shape.

Specifically, the SSH circuit according to the first embodiment is an SSH circuit including a plurality of unit lattices. Each unit lattice includes unit circuits. Each of the unit circuits includes two first inductors L1, a second inductor L2 connected in series between the two first inductors L1, and two capacitors C connected between a ground potential and two respective connection nodes at which the first inductors L1 and the second inductor L2 are connected to each other. The second inductance L2 of the second inductor L2 is larger than the first inductance L1 of the first inductors L1. In each unit lattice, two connection nodes of the unit circuits are arranged at respective vertexes of both ends of each side forming a hyperrectangle, and connection nodes arranged at each vertex are connected to each other and share a capacitor C between the connection nodes and the ground potential. The plurality of unit lattices are connected to each other by a mutual sharing of first inductors L1 by two unit lattices adjacent to each other. A peripheral edge has an uneven shape of unit lattices.

First inductors L1 that are included in the unit lattices disposed at the peripheral edge and that are not shared are grounded. The hyperrectangle includes a rectangle and a rectangular parallelepiped. In the first embodiment, the hyperrectangle is a rectangle, and the plurality of unit lattices are connected to each other in two-dimensional directions. The external shape of the SSH circuit is a rectangular shape, and at least one side of the rectangular shape has an uneven shape.

The two-dimensional SSH circuit illustrated in FIG. 19 is formed by connecting two-dimensional unit lattices as illustrated in FIG. 13 to each other in each of the first direction and the second direction within a two-dimensional plane. An uneven shape of two-dimensional unit lattices is formed on one side on a near side in the figure. In the edge mode used as a band-pass filter, standing waves are localized in two-dimensional unit lattices of peripheral edges forming edges, and a current flows through two-dimensional circuit lattices of the peripheral edges. In FIG. 19, the path of the current flowing through the two-dimensional circuit lattices of the peripheral edges is indicated by a broken line.

In the two-dimensional SSH circuit, the number of the two-dimensional unit lattices of the peripheral edges and the elements constituting the two-dimensional unit lattices is increased by forming the uneven section of the two-dimensional unit lattices on one side of the rectangular external shape. Therefore, the variation coefficient of the natural frequencies in the edge mode can be suppressed by canceling out variations between the elements. Hence, in the SSH circuit according to the first embodiment, frequency stability as desired of a band-pass filter can be achieved.

Figure 20:
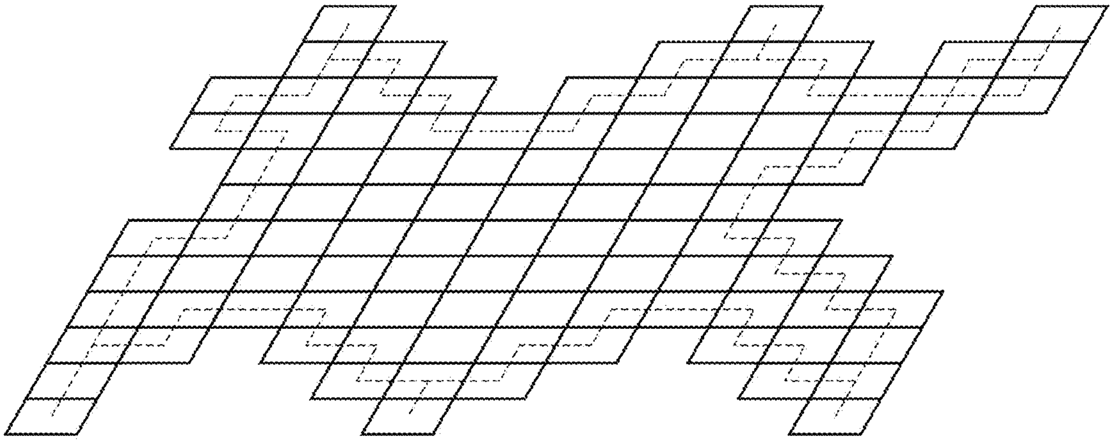
FIG. 20 is a bird's-eye view illustrating an arrangement of unit lattices in a first modification of the first embodiment.

FIG. 20 is a bird's-eye view illustrating an arrangement of unit lattices in a first modification of the SSH circuit according to the first embodiment. The first modification is different from the first embodiment in which an uneven shape is formed on one side, in that an uneven section of two-dimensional unit lattices is formed on all sides in a two-dimensional SSH circuit having a rectangular external shape in the first modification. Other configurations are similar to those of the first embodiment.

In FIG. 20, the path of the current flowing through the two-dimensional circuit lattices of the peripheral edges among the two-dimensional circuit lattices in the edge mode is indicated by a broken line. In the first modification, an uneven section of two-dimensional unit lattices is formed on all of the sides, and therefore, the number of the two-dimensional unit lattices of the peripheral edges and the elements constituting the two-dimensional unit lattices is increased more than in the first embodiment. Therefore, the variation coefficient of the natural frequencies in the edge mode can be further suppressed by canceling out variations between the elements. Hence, in the SSH circuit according to the first modification of the first embodiment, frequency stability as desired of a band-pass filter can be improved more than the SSH circuit according to the first embodiment.

Figure 21:
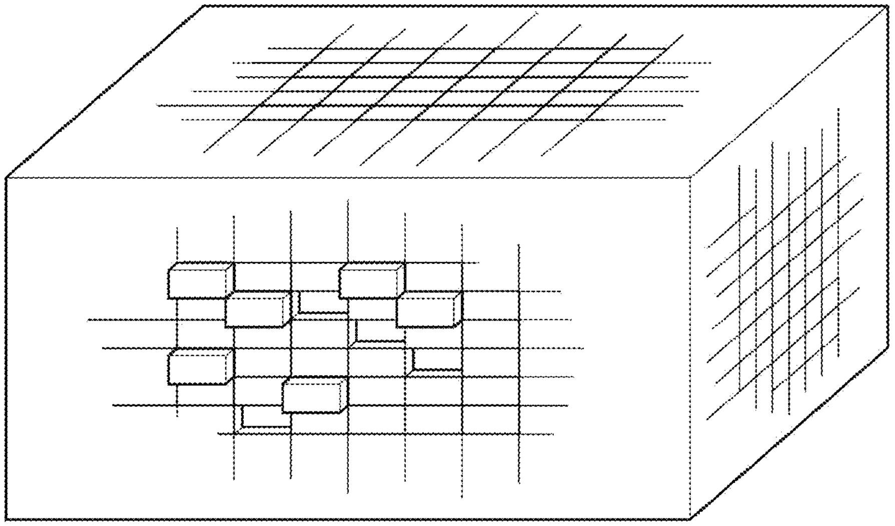
FIG. 21 is a bird's-eye view illustrating an arrangement of unit lattices in a second modification of the first embodiment.

FIG. 21 is a bird's-eye view illustrating an arrangement of unit lattices in a second modification of the SSH circuit according to the first embodiment. The second modification is different from the first embodiment in which an uneven shape is formed on one side of the rectangular external shape of the two-dimensional SSH circuit, in that an uneven section of three-dimensional unit lattices is formed in one face of a rectangular parallelepipedic external shape of a three-dimensional SSH circuit. In the second modification, the hyperrectangle is a rectangular parallelepiped, and the plurality of unit lattices are connected to each other in three-dimensional directions. This similarly applies to a third modification.

The three-dimensional SSH circuit illustrated in FIG. 21 is formed by connecting three-dimensional unit lattices as illustrated in FIG. 18 to each other in each of the three-dimensional directions. An uneven shape of three-dimensional unit lattices is formed in one face on a near side in the figure. In the edge mode, standing waves are localized in unit lattices of peripheral edges forming edges, and a current flows through three-dimensional circuit lattices of the peripheral edges.

In the three-dimensional SSH circuit, the number of the three-dimensional unit lattices of the peripheral edges and the elements constituting the three-dimensional unit lattices is increased by forming an uneven section of three-dimensional unit lattices in one face of the rectangular parallelepipedic external shape. Therefore, the variation coefficient of the natural frequencies in the edge mode can be suppressed by canceling out variations between the elements. Hence, in the SSH circuit according to the second modification of the first embodiment, frequency stability as desired of a band-pass filter can be achieved.

Figure 22:
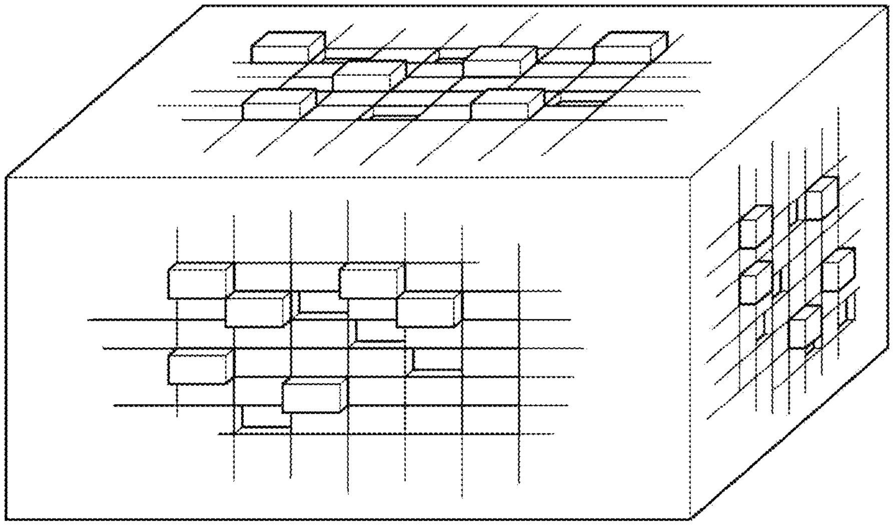
FIG. 22 is a bird's-eye view illustrating an arrangement of unit lattices in a third modification of the first embodiment.

FIG. 22 is a bird's-eye view illustrating an arrangement of unit lattices in a third modification of the SSH circuit according to the first embodiment. The third modification is different from the first embodiment in which an uneven shape is formed on one side of the rectangular external shape of the two-dimensional SSH circuit, in that, in the third modification, an uneven section of three-dimensional unit lattices is formed in all of the faces of the rectangular parallelepipedic external shape of a three-dimensional SSH circuit.

In the three-dimensional SSH circuit according to the third modification, the number of the three-dimensional unit lattices of the peripheral edges and the elements constituting the three-dimensional unit lattices is increased by forming an uneven section of three-dimensional unit lattices in all of the faces of the rectangular parallelepipedic external shape. Therefore, the variation coefficient of the natural frequencies in the edge mode can be suppressed by canceling out variations between the elements. Hence, in the SSH circuit according to the third modification of the first embodiment, frequency stability as desired of a band-pass filter can be achieved.

As compared with the second modification in which an uneven shape of three-dimensional unit lattices is formed in one face of the rectangular parallelepipedic external shape, an uneven shape of three-dimensional unit lattices is formed in all of the faces of the rectangular parallelepipedic shape in the third modification. Therefore, the number of the three-dimensional unit lattices of the peripheral edges and the elements constituting the three-dimensional unit lattices is further increased, the variation coefficient of the natural frequencies can be further suppressed by canceling out variations between the elements, and in turn, frequency stability as desired of a band-pass filter can be improved.

Second Embodiment

Figure 23:
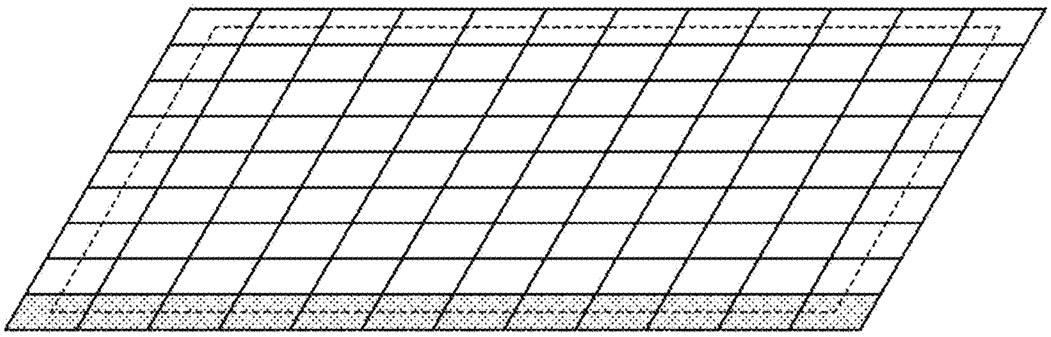
FIG. 23 is a bird's-eye view illustrating an arrangement of unit lattices in an SSH circuit according to a second embodiment.

FIG. 23 is a bird's-eye view illustrating an arrangement of unit lattices in an SSH circuit according to a second embodiment. The second embodiment has a rectangular external shape, and a characteristic variation of at least one element constituting two-dimensional unit lattices at a peripheral edge of one side of the rectangular shape is smaller than a characteristic variation of at least one element constituting other two-dimensional unit lattices. In FIG. 23, the two-dimensional unit lattices in which a characteristic variation of at least one element is small are shaded.

Specifically, the SSH circuit according to the second embodiment is an SSH circuit including a plurality of unit lattices. Each unit lattice includes unit circuits. Each of the unit circuits includes two first inductors L1, a second inductor L2 connected in series between the two first inductors L1, and two capacitors C connected between a ground potential and two respective connection nodes at which the first inductors L1 and the second inductor L2 are connected to each other. The second inductance L2 of the second inductor L2 is larger than the first inductance L1 of the first inductors L1. In each unit lattice, two connection nodes of the unit circuits are arranged at respective vertexes of both ends of each side forming a hyperrectangle, and connection nodes arranged at each vertex are connected to each other and share a capacitor C between the connection nodes and the ground potential. A characteristic variation of at least one of the first inductors L1, the second inductor L2, and the capacitors C constituting unit lattices disposed at a peripheral edge of the SSH circuit is smaller than a characteristic variation of at least one of the first inductors L1, the second inductor L2, and the capacitors C constituting unit lattices disposed in an inner part of the SSH circuit enclosed by peripheral edges.

First inductors L1 that are included in unit lattices disposed at the peripheral edges and that are not shared are grounded. The hyperrectangle includes a rectangle and a rectangular parallelepiped. The hyperrectangle in the second embodiment is a rectangle, and the plurality of unit lattices are connected to each other in two-dimensional directions. The external shape of the SSH circuit is a rectangular shape, and at least one side of the rectangular shape has an uneven shape.

The two-dimensional SSH circuit illustrated in FIG. 23 is formed by connecting two-dimensional unit lattices as illustrated in FIG. 13 to each other in each of the first direction and the second direction within a two-dimensional plane. The two-dimensional unit lattices include unit circuits including the first inductors L1, the second inductor L2, and the capacitors C as illustrated in FIG. 2. Characteristic variations of elements constituting a two-dimensional unit lattice may be variations in the values of the first inductance L1, the second inductance L2, and the capacitance C of the first inductors L1, the second inductors L2, and the capacitors C of the unit circuits constituting the two-dimensional unit lattice. This similarly applies to the following modifications.

In the edge mode used as a band-pass filter, standing waves are localized in the two-dimensional unit lattices of the peripheral edges forming edges, and a current flows through the two-dimensional circuit lattices of the peripheral edges. In FIG. 23, the path of the current flowing through the two-dimensional circuit lattices of the peripheral edges is indicated by a broken line. The variation coefficient of the natural frequencies in the edge mode can be suppressed because a characteristic variation of at least one element constituting the two-dimensional unit lattices on one side as a peripheral edge of the rectangular external shape is smaller than a characteristic variation of at least one element constituting other two-dimensional unit lattices. Hence, in the SSH circuit according to the second embodiment, frequency stability as desired of a band-pass filter can be achieved.

Figure 24:
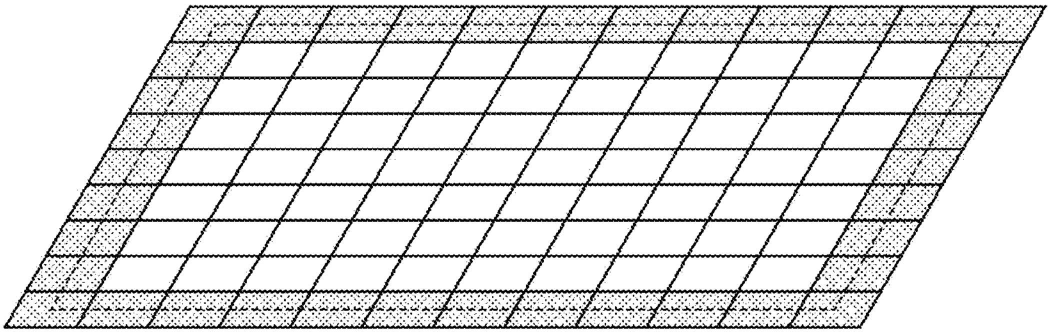
FIG. 24 is a bird's-eye view illustrating an arrangement of unit lattices in a first modification of the second embodiment.

FIG. 24 is a bird's-eye view illustrating an arrangement of unit lattices in a first modification of the SSH circuit according to the second embodiment. The first modification is different from the second embodiment in which a characteristic variation of at least one element constituting two-dimensional lattices along a peripheral edge of one side is small, in that, in the first modification, a characteristic variation of at least one element constituting two-dimensional unit lattices at peripheral edges of all of sides in a two-dimensional SSH circuit having a rectangular external shape is smaller than a characteristic variation of at least one element constituting other two-dimensional lattices. Other configurations are similar to those of the second embodiment. In FIG. 24, the two-dimensional unit lattices in which a characteristic variation of at least one element is small are shaded.

In FIG. 24, the path of a current flowing through the two-dimensional circuit lattices of the peripheral edges among the two-dimensional circuit lattices in the edge mode is indicated by a broken line. In the first modification, the variation coefficient of the natural frequencies in the edge mode can be further suppressed because of a small characteristic variation of at least one element constituting the two-dimensional unit lattices of all of the sides as the peripheral edges where the current flows. Hence, in the SSH circuit according to the first modification of the second embodiment, frequency stability as desired of a band-pass filter can be improved more than in the SSH circuit according to the second embodiment.

Figure 25:
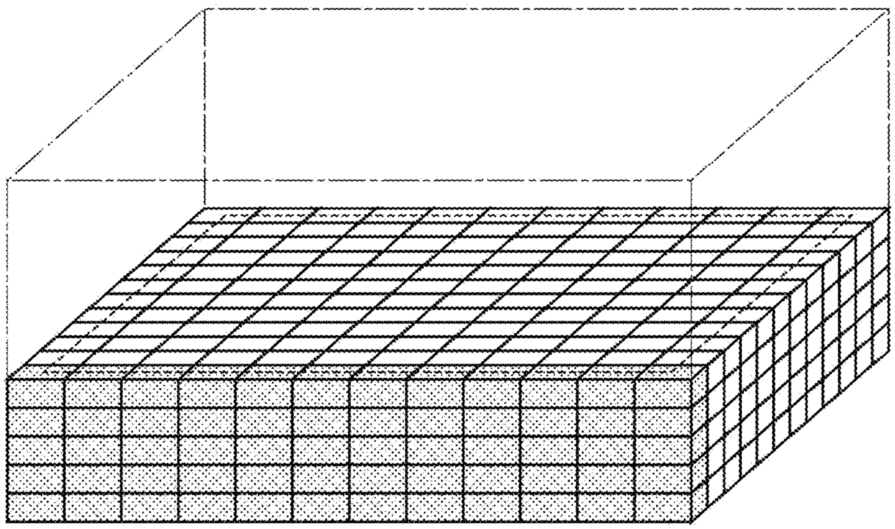
FIG. 25 is a cutaway bird's-eye view illustrating an arrangement of unit lattices in a second modification of the second embodiment.

FIG. 25 is a cutaway bird's-eye view illustrating an arrangement of unit lattices in a second modification of the SSH circuit according to the second embodiment. The second modification is different from the second embodiment in which a characteristic variation of at least one element constituting two-dimensional lattices along a peripheral edge of one side of a two-dimensional SSH circuit is small, in that, in the second modification, a characteristic variation of at least one element constituting three-dimensional unit lattices at a peripheral edge of one face in a three-dimensional SSH circuit having a rectangular parallelepipedic external shape is smaller than a characteristic variation of at least one element constituting other three-dimensional unit lattices. In FIG. 25, the three-dimensional unit lattices in which a characteristic variation of at least one element is small are shaded. In the second modification, the hyperrectangle is a rectangular parallelepiped, and the plurality of unit lattices are connected to each other in the three-dimensional directions. This similarly applies to the third modification.

The three-dimensional SSH circuit illustrated in FIG. 25 is formed by connecting three-dimensional unit lattices as illustrated in FIG. 18 to each other in each of the three-dimensional directions. The three-dimensional unit lattices include unit circuits including the first inductors L1, the second inductor L2, and the capacitors C as illustrated in FIG. 2.

In FIG. 25, the path of a current flowing through the three-dimensional circuit lattices of peripheral edges among the three-dimensional circuit lattices in the edge mode is indicated by a broken line. In the second modification, the variation coefficient of the natural frequencies in the edge mode can be suppressed because of a small characteristic variation of at least one element constituting the three-dimensional unit lattices of one face at the peripheral edge where the current flows. Hence, in the SSH circuit according to the second modification of the second embodiment, frequency stability as desired of a band-pass filter can be achieved.

Figure 26:
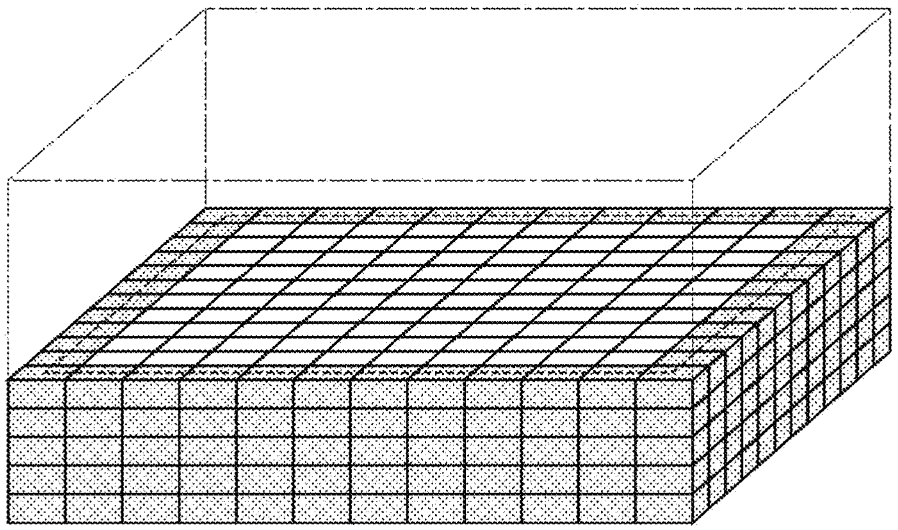
FIG. 26 is a cutaway bird's-eye view illustrating an arrangement of unit lattices in a third modification of the second embodiment.

FIG. 26 is a cutaway bird's-eye view illustrating an arrangement of unit lattices in a third modification of the SSH circuit according to the second embodiment. The third modification is different from the second embodiment in which a characteristic variation of at least one element constituting two-dimensional lattices along the peripheral edge of one side of a two-dimensional SSH circuit is reduced, in that, in the third modification, a characteristic variation of at least one element constituting three-dimensional unit lattices at the peripheral edges of all of faces in a three-dimensional SSH circuit having a rectangular parallelepipedic external shape is smaller than a characteristic variation of at least one element constituting other three-dimensional unit lattices. In FIG. 26, the three-dimensional unit lattices in which a characteristic variation of at least one element is small are shaded.

In FIG. 26, the path of a current flowing through the three-dimensional circuit lattices of the peripheral edges among the three-dimensional circuit lattices in the edge mode is indicated by a broken line. In the third modification, the variation coefficient of the natural frequencies in the edge mode can be suppressed because of a small characteristic variation of at least one element constituting the three-dimensional unit lattices of all of the faces of the peripheral edges where the current flows. Hence, in the SSH circuit according to the third modification of the second embodiment, frequency stability as desired of a band-pass filter can be achieved.

As compared with the second modification in which a characteristic variation of at least one element constituting the three-dimensional unit lattices of one face of the rectangular parallelepipedic external shape is small, a characteristic variation of at least one element constituting the three-dimensional unit lattices of all of the faces of the rectangular parallelepipedic shape is small in the third modification. Therefore, a characteristic variation of at least one element constituting the unit lattices of the peripheral edges is further reduced as a whole. Hence, the variation coefficient of the natural frequencies can be further suppressed, and in turn, frequency stability as desired of a band-pass filter can be improved.

Incidentally, the SSH circuit according to the second embodiment may be combined with the SSH circuit according to the first embodiment. For example, an uneven shape may be formed in the two-dimensional unit circuits on at least one side of the two-dimensional SSH circuit having a rectangular external shape as illustrated in FIG. 19, and a characteristic variation of at least one element constituting the two-dimensional unit circuits of at least the peripheral edge of one side of the two-dimensional SSH circuit may be smaller than a characteristic variation of at least one element constituting the other two-dimensional unit circuits. Thus combining the first embodiment and the second embodiment with each other increases the number of the two-dimensional unit lattices of the peripheral edge or edges and the elements constituting the two-dimensional unit lattices, thus canceling out variations between the elements, and reduces a characteristic variation of at least one element constituting the two-dimensional unit circuits of the peripheral edge or edges. The variation coefficient of the natural frequencies can be consequently decreased. The first embodiment and the second embodiment can be similarly combined with each other also in a three-dimensional SSH circuit.

Other Embodiments

As described above, while embodiments have been described, the statements and the drawings constituting a part of the disclosure are illustrative and are not to be understood to be restrictive. Various alternative embodiments, examples, and application technologies will become apparent to those skilled in the art from this disclosure. Thus, the present embodiments include various embodiments and other examples not described herein. The following are examples of various modes.

(1) An SSH circuit including:
a plurality of unit lattices, in which
each unit lattice includes unit circuits,
each unit circuit includes two first inductors, a second inductor connected in series between the two first inductors, and two capacitors connected between a ground potential and two respective connection nodes at which the first inductors and the second inductor are connected to each other, an inductance of the second inductor being larger than an inductance of the first inductors,
in each unit lattice, the two connection nodes of each unit circuit are arranged at respective vertexes of both ends of each side forming a hyperrectangle, and the connection nodes arranged at each vertex are connected to each other and share the corresponding capacitor between the connection nodes and the ground potential,
the plurality of unit lattices are connected to each other by a mutual sharing of the first inductors by two unit lattices adjacent to each other, and
a peripheral edge has an uneven shape of unit lattices.
(2) The SSH circuit according to (1), in which
the first inductors that are included in the unit lattices disposed at the peripheral edge and that are not shared are grounded.
(3) The SSH circuit according to (1) or (2), in which
the hyperrectangle is a rectangle, and the plurality of unit lattices are connected to each other in two-dimensional directions.
(4) The SSH circuit according to (3), in which
an external shape of the SSH circuit is a rectangular shape, and at least one side of the rectangular shape has the uneven shape.
(5) The SSH circuit according to (4), in which
all sides of the rectangular shape have the uneven shape.
(6) The SSH circuit according to (1) or (2), in which
the hyperrectangle is a rectangular parallelepiped, and the plurality of unit lattices are connected to each other in three-dimensional directions.
(7) The SSH circuit according to (6), in which
an external shape of the SSH circuit is a rectangular parallelepipedic shape, and at least one face of the rectangular parallelepipedic shape has the uneven shape.
(8) The SSH circuit according to (7), in which
all faces of the rectangular parallelepipedic shape have the uneven shape.
(9) The SSH circuit according to (1), in which
a characteristic variation of at least one of the first inductors, the second inductor, and the capacitors constituting the unit lattices disposed at the peripheral edge of the SSH circuit is smaller than a characteristic variation of at least one of the first inductors, the second inductor, and the capacitors constituting the unit lattices disposed in an inner part of the SSH circuit enclosed by the peripheral edge.
(10) An SSH circuit including:
a plurality of unit lattices, in which
each unit lattice includes unit circuits,
each unit circuit includes two first inductors, a second inductor connected in series between the two first inductors, and two capacitors connected between a ground potential and two respective connection nodes at which the first inductors and the second inductor are connected to each other, an inductance of the second inductor being larger than an inductance of the first inductors,
in each unit lattice, the two connection nodes of each unit circuit are arranged at respective vertexes of both ends of each side forming a hyperrectangle, and the connection nodes arranged at each vertex are connected to each other and share the corresponding capacitor between the connection nodes and the ground potential, and
a characteristic variation of at least one of the first inductors, the second inductor, and the capacitors constituting the unit lattices disposed at a peripheral edge of the SSH circuit is smaller than a characteristic variation of at least one of the first inductors, the second inductor, and the capacitors constituting the unit lattices disposed in an inner part of the SSH circuit enclosed by the peripheral edge.
(11) The SSH circuit according to (10), in which
the first inductors that are included in the unit lattices disposed at the peripheral edge and that are not shared are grounded.
(12) The SSH circuit according to (10) or (11), in which
the hyperrectangle is a rectangle, and the plurality of unit lattices are connected to each other in two-dimensional directions.
(13) The SSH circuit according to (12), in which
an external shape of the SSH circuit is a rectangular shape, and at least one side of the rectangular shape has an uneven shape.
(14) The SSH circuit according to (13), in which
all sides of the rectangular shape have the uneven shape.
(15) The SSH circuit according to (10) or (11), in which
the hyperrectangle is a rectangular parallelepiped, and the plurality of unit lattices are connected to each other in three-dimensional directions.
(16) The SSH circuit according to (15), in which
an external shape of the SSH circuit is a rectangular parallelepipedic shape, and at least one face of the rectangular parallelepipedic shape has an uneven shape.
(17) The SSH circuit according to (16), in which
all faces of the rectangular parallelepipedic shape have the uneven shape.
(18) An electronic device including:
a board; and
the SSH circuit according to any one of (1) to (17) formed on the board.
(19) The electronic device according to (18), in which
the hyperrectangle is a rectangle, the plurality of unit lattices are connected to each other in two-dimensional directions, and the SSH circuit including the unit lattices is formed on a surface of the board.
(20) The electronic device according to (18), in which
the hyperrectangle is a rectangular parallelepiped, the plurality of unit lattices are connected to each other in three-dimensional directions, and the SSH circuit including the unit lattices is formed at least within the board.

According to (1) to (20), the frequency stability of the SSH circuit and the electronic device including the SSH circuit can be improved, and in turn, the characteristics of a band-pass filter including the SSH circuit or the SSH circuit included in the electronic device can be ensured.

According to the present disclosure, the frequency stability of the SSH circuit and the electronic device including the SSH circuit can be improved, and in turn, the characteristics of a band-pass filter including the SSH circuit or the SSH circuit included in the electronic device can be ensured.

What is claimed is:

1. A Su-Schrieffer-Heeger (SSH) circuit comprising:
a plurality of unit lattices, wherein
each unit lattice of the plurality of unit lattices includes unit circuits,
each unit circuit of the unit circuits includes two first inductors, a second inductor connected in series between the two first inductors, and two capacitors connected between a ground potential and two respective connection nodes at which the two first inductors and the second inductor are connected to each other, an inductance of the second inductor being larger than an inductance of the two first inductors,
in the each unit lattice, the two respective connection nodes of the each unit circuit are arranged at respective vertexes of two ends of each side forming a hyperrectangle, and the two respective connection nodes arranged at each vertex are connected to each other and share a corresponding capacitor of the two capacitors between the two respective connection nodes and the ground potential,
the plurality of unit lattices are connected to each other by a mutual sharing of the two first inductors by two unit lattices of the plurality of unit lattices adjacent to each other, and
a peripheral edge of the SSH circuit has an uneven shape of unit lattices.

2. The SSH circuit according to claim 1, wherein
the two first inductors that are included in the plurality of unit lattices disposed at the peripheral edge and that are not shared are grounded.

3. The SSH circuit according to claim 1, wherein
the hyperrectangle is a rectangle, and the plurality of unit lattices are connected to each other in two-dimensional directions.

4. The SSH circuit according to claim 3, wherein
an external shape of the SSH circuit is a rectangular shape, and at least one side of the rectangular shape has the uneven shape.

5. The SSH circuit according to claim 4, wherein
all sides of the rectangular shape have the uneven shape.

6. The SSH circuit according to claim 1, wherein
the hyperrectangle is a rectangular parallelepiped, and the plurality of unit lattices are connected to each other in three-dimensional directions.

7. The SSH circuit according to claim 6, wherein
an external shape of the SSH circuit is a rectangular parallelepipedic shape, and at least one face of the rectangular parallelepipedic shape has the uneven shape.

8. The SSH circuit according to claim 7, wherein
all faces of the rectangular parallelepipedic shape have the uneven shape.

9. The SSH circuit according to claim 1, wherein
a characteristic variation of at least one of the two first inductors, the second inductor, and the two capacitors constituting the plurality of unit lattices disposed at the peripheral edge of the SSH circuit is smaller than a characteristic variation of at least one of the two first inductors, the second inductor, and the two capacitors constituting the plurality of unit lattices disposed in an inner part of the SSH circuit enclosed by the peripheral edge.

10. An electronic device comprising:
a board; and
the SSH circuit according to claim 1 formed on the board.

11. The electronic device according to claim 10, wherein
the hyperrectangle is a rectangle, the plurality of unit lattices are connected to each other in two-dimensional directions, and the SSH circuit including the plurality of unit lattices is formed on a surface of the board.

12. The electronic device according to claim 10, wherein
the hyperrectangle is a rectangular parallelepiped, the plurality of unit lattices are connected to each other in three-dimensional directions, and the SSH circuit including the plurality of unit lattices is formed at least within the board.

13. A Su-Schrieffer-Heeger (SSH) circuit comprising:
a plurality of unit lattices, wherein
each unit lattice of the plurality of unit lattices includes unit circuits,
each unit circuit of the unit circuits includes two first inductors, a second inductor connected in series between the two first inductors, and two capacitors connected between a ground potential and two respective connection nodes at which the two first inductors and the second inductor are connected to each other, an inductance of the second inductor being larger than an inductance of the two first inductors,
in the each unit lattice, the two respective connection nodes of the each unit circuit are arranged at respective vertexes of two ends of each side forming a hyperrectangle, and the two respective connection nodes arranged at each vertex are connected to each other and share a corresponding capacitor of the two capacitors between the two respective connection nodes and the ground potential, and
a characteristic variation of at least one of the two first inductors, the second inductor, and the two capacitors constituting the plurality of unit lattices disposed at a peripheral edge of the SSH circuit is smaller than a characteristic variation of at least one of the two first inductors, the second inductor, and the two capacitors constituting the plurality of unit lattices disposed in an inner part of the SSH circuit enclosed by the peripheral edge.

14. The SSH circuit according to claim 13, wherein
the two first inductors that are included in the plurality of unit lattices disposed at the peripheral edge and that are not shared are grounded.

15. The SSH circuit according to claim 13, wherein
the hyperrectangle is a rectangle, and the plurality of unit lattices are connected to each other in two-dimensional directions.

16. The SSH circuit according to claim 15, wherein
an external shape of the SSH circuit is a rectangular shape, and at least one side of the rectangular shape has an uneven shape.

17. The SSH circuit according to claim 16, wherein
all sides of the rectangular shape have the uneven shape.

18. The SSH circuit according to claim 13, wherein
the hyperrectangle is a rectangular parallelepiped, and the plurality of unit lattices are connected to each other in three-dimensional directions.

19. The SSH circuit according to claim 18, wherein
an external shape of the SSH circuit is a rectangular parallelepipedic shape, and at least one face of the rectangular parallelepipedic shape has an uneven shape.

20. The SSH circuit according to claim 19, wherein all faces of the rectangular parallelepipedic shape have the uneven shape.

* * * * *